United States Patent
Kwong

(10) Patent No.: US 9,775,254 B2
(45) Date of Patent: *Sep. 26, 2017

(54) ALUMINUM OXIDE CONTROL MECHANISM

(71) Applicant: Apple Inc., Cupertino, CA (US)

(72) Inventor: Kelvin Kwong, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 64 days.

This patent is subject to a terminal disclaimer.

(21) Appl. No.: 14/875,340

(22) Filed: Oct. 5, 2015

(65) Prior Publication Data

US 2016/0037658 A1    Feb. 4, 2016

Related U.S. Application Data

(63) Continuation of application No. 13/679,673, filed on Nov. 16, 2012, now Pat. No. 9,153,391.

(51) Int. Cl.
| | |
|---|---|
| *H01H 13/02* | (2006.01) |
| *H05K 5/00* | (2006.01) |
| *H01H 9/16* | (2006.01) |
| *H05K 5/02* | (2006.01) |
| *H05K 5/03* | (2006.01) |

(52) U.S. Cl.
CPC ........... *H05K 5/0017* (2013.01); *H01H 9/161* (2013.01); *H01H 13/023* (2013.01); *H05K 5/0217* (2013.01); *H05K 5/03* (2013.01)

(58) Field of Classification Search
CPC ......... H01H 9/161; H05K 5/0017; H05K 5/03
USPC ............ 200/313–315, 330, 341, 517
See application file for complete search history.

(56) References Cited

U.S. PATENT DOCUMENTS

| | | | | |
|---|---|---|---|---|
| 5,804,780 | A * | 9/1998 | Bartha | H01H 9/181 200/5 A |
| 6,355,890 | B1 * | 3/2002 | Kuroda | H01H 13/70 200/345 |
| 6,765,149 | B1 * | 7/2004 | Ku | H02G 3/14 174/66 |
| 7,511,701 | B2 | 3/2009 | Nuovo | |
| 7,915,556 | B2 * | 3/2011 | Ou | G06F 3/0202 200/516 |
| 8,158,900 | B2 * | 4/2012 | Maatta | H01H 13/83 200/314 |
| 8,299,379 | B2 | 10/2012 | Jiang et al. | |
| 9,153,391 | B2 * | 10/2015 | Kwong | H01H 9/161 |

(Continued)

*Primary Examiner* — Felix O Figueroa
(74) *Attorney, Agent, or Firm* — Brownstein Hyatt Farber Schreck, LLP

(57) ABSTRACT

A control mechanism comprises a housing defining an interior and an exterior, an aperture formed in the housing and extending from the interior to the exterior thereof, an actuator on the interior of the housing, proximate the control aperture, and a control member positionable within the aperture to operate the actuator. The control member comprises a first surface exposed to the exterior of the housing, a second surface proximate the actuator within the housing, and a body portion extending therebetween, the body portion being formed of a substantially single crystal aluminum oxide material. A bias member is configured to bias the body portion of the control member toward an inner surface of the housing, such that the control member is retained within the aperture in operation of the actuator.

19 Claims, 7 Drawing Sheets

(56) References Cited

U.S. PATENT DOCUMENTS

2011/0186414 A1    8/2011  Kim et al.
2013/0328798 A1*  12/2013  Chen ...................... H01H 1/027
                                                          345/173

* cited by examiner

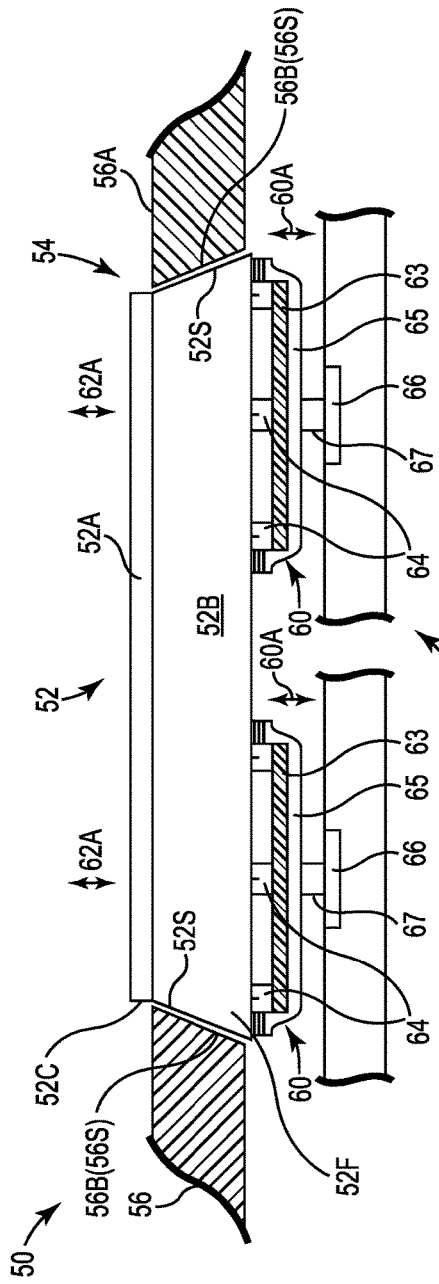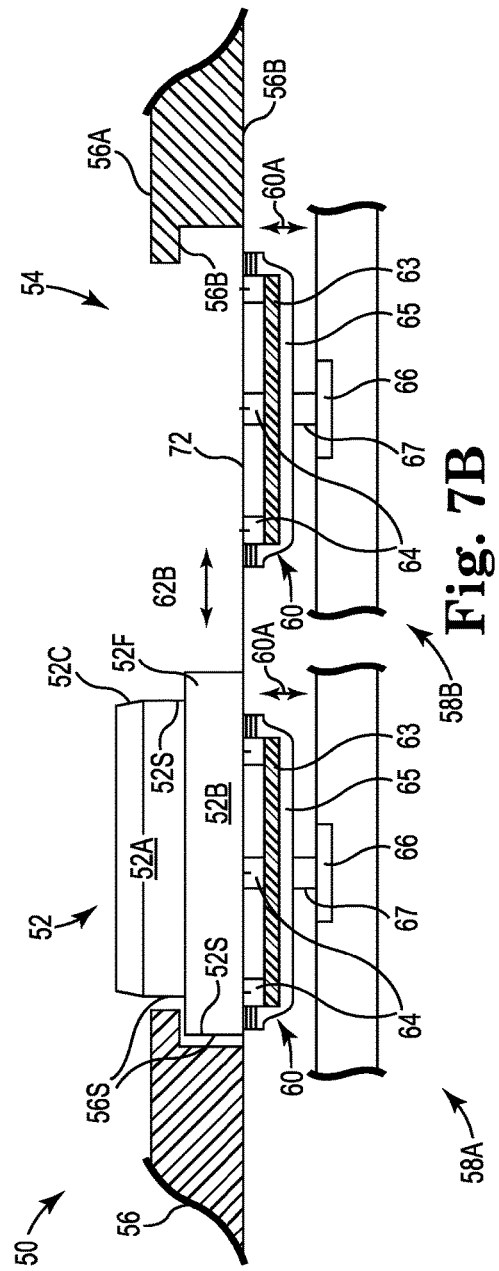

ALUMINUM OXIDE CONTROL MECHANISM

This application is a continuation of U.S. patent application Ser. No. 13/679,673, entitled "Aluminum Oxide Control Mechanism," filed on Nov. 16, 2012, which is incorporated by reference in its entirety as if fully disclosed herein.

TECHNICAL FIELD

This subject matter of this disclosure relates generally to control components for electronic devices. In particular, the disclosure relates to buttons, switches, and other control mechanisms suitable for use in electronic devices, including, but not limited to, cellular phones, tablet computers, personal computers, personal digital assistants, media players, and other stationary and portable electronic devices.

BACKGROUND

Depending on application, electronic devices may utilize a wide variety of different control mechanisms, including buttons, pushbuttons, slide and toggle switches, and other devices for power, volume, home, hold, reset and other control and input functions. In use, these components are subject to a wide range of different environmental effects, including temperature extremes, humidity, contamination, physical and electrical contact, scratching, and impact, for which durability and reliability are critical engineering factors.

Environmental factors are particularly relevant in devices subject to both operational extremes and high performance demands, including portable electronics and mobile devices, where both internal and external control components must withstand heat, cold, moisture, humidity, shock and impact. The associated design and engineering considerations include tradeoffs between stress and strain resistance, machinability, temperature stability, and thermal properties, including surface hardness and resistance to scratching, cracking, thermal deformation, and other effects. Thus, there is a need for improved control mechanisms, particularly in the area of consumer electronics, including, but not limited to, portable electronics and mobile devices.

SUMMARY

This disclosure relates to control mechanisms with an aluminum oxide or sapphire control member for actuating or operating an actuator, and electronic devices utilizing such control mechanisms. In various applications and embodiments, a control aperture is defined in a device housing, extending from the interior to the exterior of the device. An actuator is positioned on the interior of the housing, proximate the control aperture, and the control member is positioned within the aperture to operate the actuator.

Depending on configuration, the control member may include a first surface exposed to the exterior of the housing, a second surface proximate the actuator on the interior of the housing, and a body portion extending between the first and second surfaces. The body portion of the control member is formed of a substantially single crystal aluminum oxide material, for example sapphire, corundum, or ruby. A biasing member is configured to bias the body portion of the control member against an inner surface of the housing, so that the control member is retained within the aperture when positioned to actuate the actuator.

In various examples and aspects of the control mechanism, the body portion of the control member can include a flange, where the bias member biases the flange against an inner surface of the housing to retain the control member within the aperture. The first and second surfaces of the control member may be oriented along parallel crystal planes. One or more side surfaces may extend between the first and second surfaces, oriented along orthogonal crystal planes. Facets can be formed between the side surfaces and the first surface of the control member, with skew crystal plane orientations.

The aluminum oxide material may include a metal component selected for light transmission properties, for example one or more of iron, titanium, chromium, copper, and magnesium. The light transmission properties may include a substantially transparent or translucent color or hue. In additional examples, a portable electronic device may include the control mechanism, for example with the control member configured as a pushbutton, sliding switch member, or rocker-type switch member.

Alternatively, a housing may extend about the electronic device, with an aperture defined in the housing. An actuator can be positioned within the housing, in combination with a control member positioned in the aperture. The control member can be formed of a substantially single crystal aluminum oxide material, with a control surface portion for actuating the actuator, a body portion extending from the control surface portion to a contact surface portion exposed to the exterior of the device, and a flange portion extending laterally from the body portion.

The control surface portion and the contact surface portion of the control member are formed with control and contact surfaces, respectively, which can be oriented along substantially parallel crystal planes of the aluminum oxide material. A biasing element can be configured to bias the flange portion of the control member against an inner surface of the housing, so that the body of the control member is retained within the aperture when actuating the actuator.

Side surfaces can be defined on the control member, extending between the control and contact surfaces and oriented along substantially orthogonal crystal planes, as defined with respect to the substantially parallel planes of the control and contact surfaces. Facets can be formed between the side surfaces and the contact surface, oriented along skew crystal planes. An indicia can be formed in the control surface, where the aluminum oxide material comprises a metal component selected for light transmission properties, such that the indicia is visible through the contact surface.

In other examples, a mobile device includes a housing with front glass, a back glass, and a side housing. Generally, the side housing can extend circumferentially about the mobile device, between the front glass and the back glass. A control aperture can be defined in the housing, extending from the interior to the exterior of the device, with a control actuator proximate the aperture, on the interior of the housing.

A sapphire control member may be positioned within the control aperture, with a control surface for actuating the actuator and a body portion extending from the control surface to a contact surface, which is exposed to the exterior of the housing. The control surface and the contact surface can be oriented along substantially parallel crystal planes, and the body portion can be configured to retain the control member within the control aperture.

Depending on application, a flange may be formed on the body portion of the sapphire control member, with the flange being biased against an inner surface of the housing to retain the sapphire control member within the aperture during operation. The aperture may be defined in the front glass of the device, with the control member configured as a pushbutton for actuating the control actuator based on a force applied to the contact surface, from the exterior of the housing.

Alternatively, the control aperture may be defined in the side housing, with the control member configured as a pushbutton, slide member, or rocker switch member. Side surfaces may be defined on the body portion of the control member, extending substantially perpendicularly between the control and contact surfaces. The side surfaces may have a substantially elliptical or circular geometry, as defined independently of the sapphire crystal plane geometry of the body portion.

BRIEF DESCRIPTION OF THE DRAWINGS

FIG. 7A is a cross-sectional view of the control device, showing the control member in a dual actuator or rocker switch configuration.

FIG. 7B is a cross-sectional view of the control device, showing the control member in a sliding switch configuration.

DETAILED DESCRIPTION

Figure 1A:
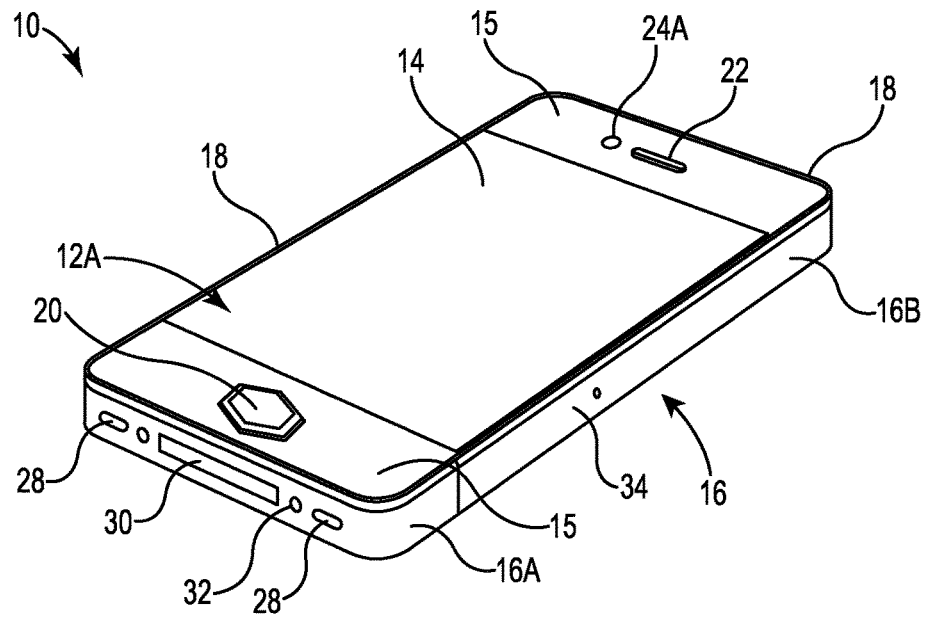
FIG. 1A is a front perspective view of an electronic device, in a communications embodiment, with a single crystal aluminum oxide control mechanism.
Figure 1B:
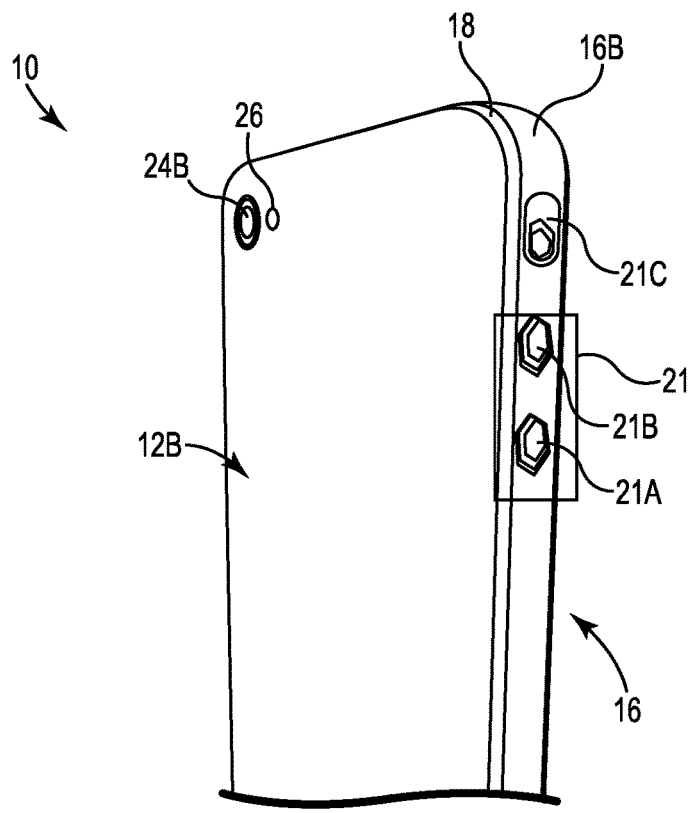
FIG. 1B is a rear perspective view of the device in FIG. 1A, showing additional single crystal control mechanisms.

FIG. 1A is a perspective view of electronic device 10, in a communications embodiment, for example a portable phone or digital assistant. FIG. 1A is a front view of device 10, showing front cover (or cover glass) 12A. FIG. 1B is an alternate perspective view of device 10, showing rear cover (or cover glass) 12B. In this particular example, display window 14 is defined in front cover glass 12A, for example between opaque border regions 15.

Front and back cover glass components 12A and 12B are coupled to housing 16 to enclose electronic device 10, for example using a bezel or frame assembly 18 to couple front and back glass components 12A and 12B between bottom and top portions 16A and 16B of housing 16. Depending on configuration, front cover glass 12A may also accommodate one or more interactive control mechanisms 20, for example with a hold button or other control member formed of a single crystal aluminum oxide or sapphire material to provide scratch and impact resistance, durability, and increased surface hardness, as described below.

Electronic device 10 may also be configured for a range of different applications, including not only portable phones, digital assistants and other communications devices, as illustrated in FIGS. 1A and 1B, but also personal computers, tablet computers, computer displays, media players, and other portable and stationary electronic devices. A variety of additional control features may also be provided, for example one or more audio buttons or other control mechanisms 21 in housing 16, including one or more volume button mechanisms 21A and 21B or mute switch mechanisms 21C in top portion 16B of housing 16, as shown in FIG. 1B. Device 10 may also include additional features and accessories, including, but not limited to, audio features 22 (e.g., speakers and microphones), front and back cameras 24A and 24B, and lighting or indicator features 26 (e.g., a flash unit, light emitting diode, or other indicator or illumination device).

Housing 16 and frame 18 are typically formed of metals or other durable materials, for example aluminum or stainless steel, or a durable plastic or composite material. Housing 16 and frame 18 may also be configured to accommodate additional accessory features, including, but not limited to, speaker or microphone apertures 28, connector apertures 30 for power and data communications, mechanical fasteners 32, and access ports 34 (e.g., for a subscriber identity module, flash memory device, or other internal component). These features may be variously arranged on front and back cover glasses 12A and 12B, and on the different components of housing 16, for example along bottom housing 16A and top housing 16B, as shown in FIGS. 1A and 1B, or in any combination of the other configurations described below.

Figure 2A:
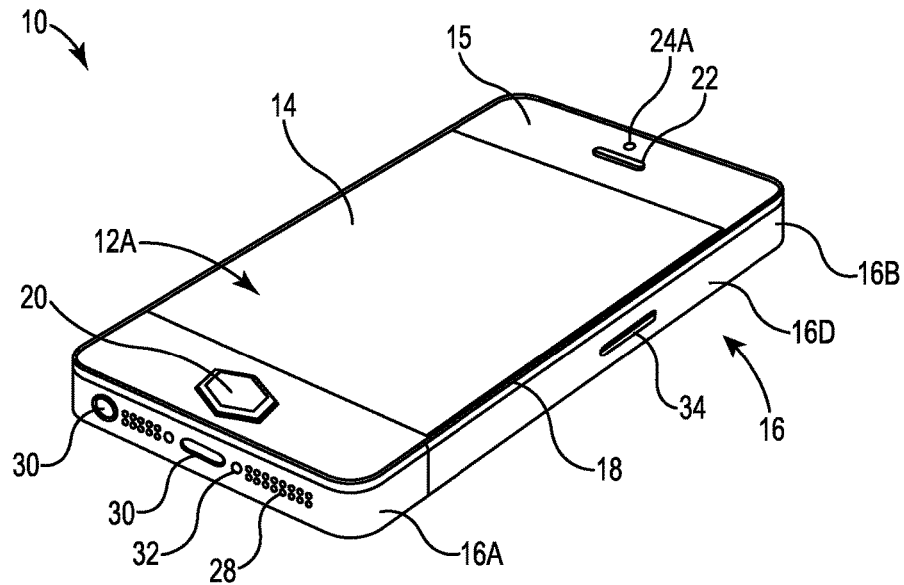
FIG. 2A is a front perspective view of the electronic device, in an alternate communications configuration.
Figure 2B:
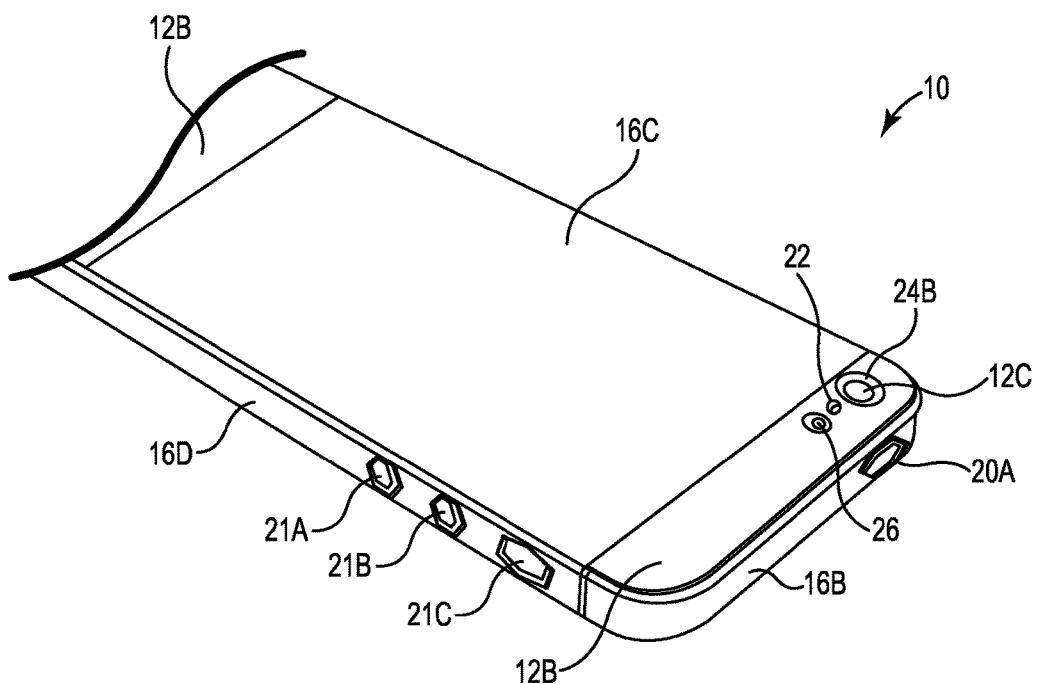
FIG. 2B is a rear perspective view of the device in FIG. 2A.

FIG. 2A is a front view of electronic device 10 in an alternate configuration, for example an advanced portable device or smart phone. As shown in FIG. 2A, single crystal sapphire control button or member 20 is provided in front glass 12A, with display window 14 defined within borders 15. FIG. 2B is a back view of device 10, showing back glass 12B as two separate inlay or inset components, with or without a separate cover glass element 12C for back camera 24B.

As shown in FIGS. 2A and 2B, housing 16 can be provided in a multi-piece beveled configuration, with bottom housing 16A, top housing 16B, and middle plate 16C. Middle plate 16C extends across the back of device 10, between back glass insets 12B, forming side housing portions 16D between top and bottom housings 16A and 16B. Device 10 may also accommodate a range of different control members 20 and 21A-210, as described above, including buttons, slide switches, and rocker switch components. Additional control features may also be included on device 10, for example hold button mechanism 20A in top housing 16B, along with various accessories and other features 22, 24A-B, 26, 28, 30, and 32.

Figure 3A:
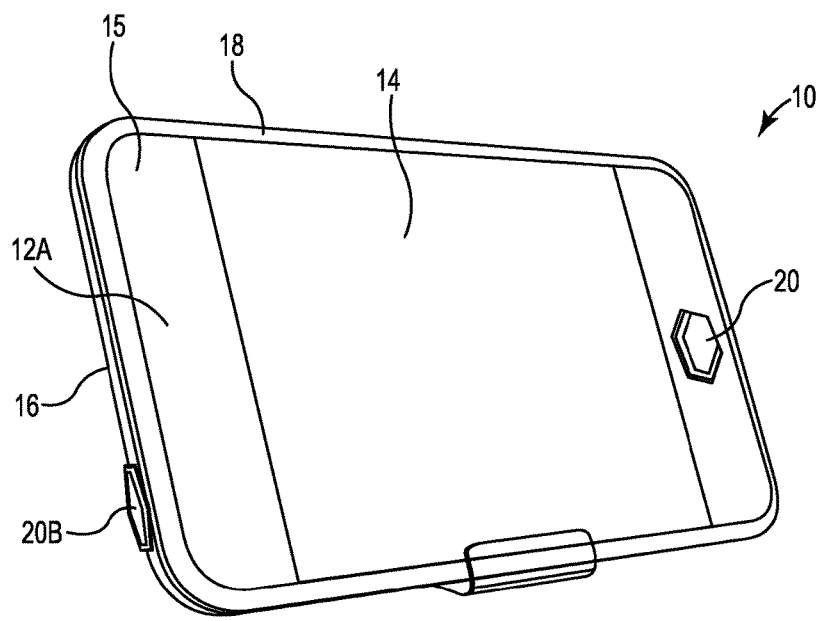
FIG. 3A is a front perspective view of the electronic device, in a media player configuration.

FIG. 3A is a front view of electronic device 10, in a media player embodiment, showing display window 14 within frame 15 in front glass 12A. Control member 20B is provided in a side portion of housing 16. As illustrated by FIG. 3A, the horizontal and vertical orientations of device 10 are arbitrary, and the various top, bottom, and side designations of the different components of device 10 can be interchanged, without loss of generality.

In one particular configuration, housing 16 may have a substantially unitary construction, formed together with the back cover of device 10. One or both of housing 16 and frame 18 can also be formed of a plastic or other durable polymer material, or using a combination of metal, polymer, plastic and composite materials, and front glass 12A can be attached to housing 16 via adhesive coupling to frame 18.

Figure 3B:
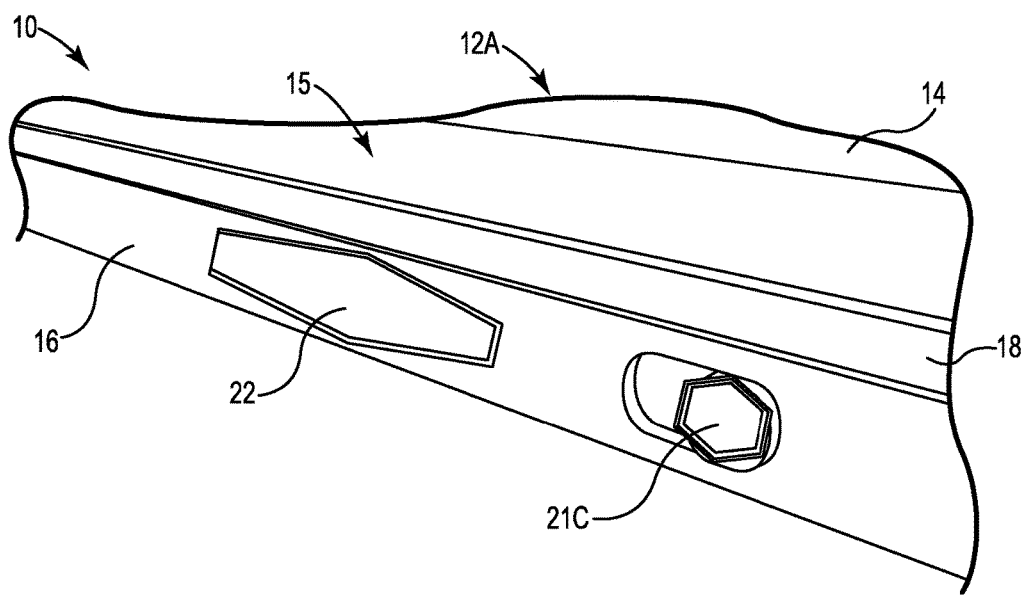
FIG. 3B is a side perspective view of the electronic device, in a tablet computer configuration.

FIG. 3B is a front view of electronic device 10, in a computer embodiment, for example a tablet computer, pad computer, or other hand-held computing device, or a computer monitor or display. Front glass 12 accommodates display window 14, as described above. One or more control features such as rocker-type volume switch members 21 and sliding mute switch members 21C are provided in the top, bottom or side portions of housing 16. As shown in FIG. 3B, housing 16 may be coupled to front glass 12A with a beveled frame assembly 18, or utilizing an internal bezel groove in either frame 18 or housing 16.

Figure 4:
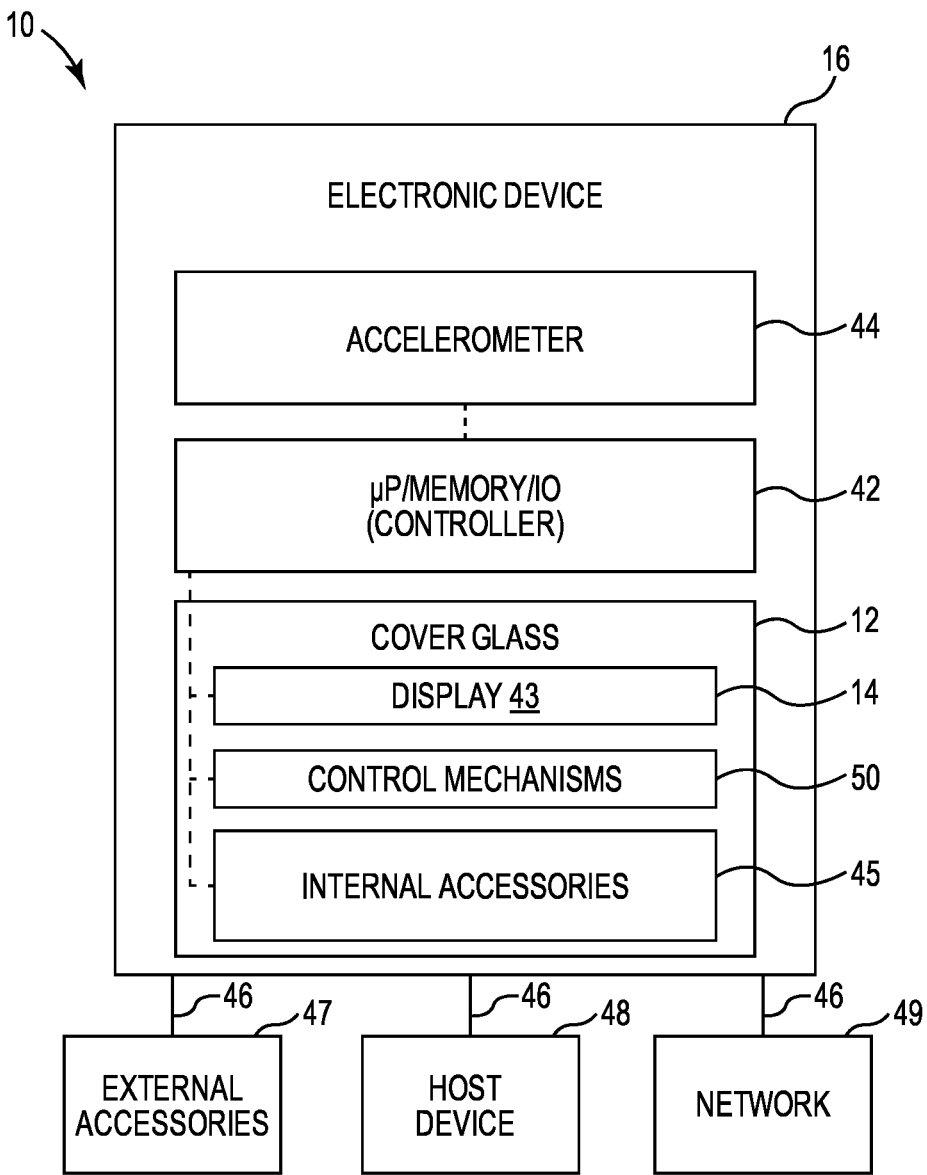
FIG. 4 is a block diagram illustrating internal and external components of the electronic device.

FIG. 4 is a block diagram illustrating various internal and external components of electronic device 10, including controller 42, display 43 within display window 14, accelerometer 44, and internal accessories 45. Hard-wired or wireless connections 46 may be provided to various external accessories 47, host devices 48, or networks 49. One or more control mechanisms 50 are provided in cover glass 12 or housing 16, or both, including, but not limited to, home buttons and other pushbutton-type control mechanisms 20, and different rocker, toggle, and slide switch or button mechanisms 20A-20B, 21, and 21A-D. Control mechanisms 50 may utilize single crystal sapphire control members or switch elements, as described below, providing improved surface hardness, scratch resistance and durability.

Device 10 encompasses a range of different portable and stationary electronic applications, as well as hybrid devices such as mobile telephones with media player capabilities, game players, remote global positioning and telecommunications devices, laptop, desktop, notebook, handheld and ultraportable computer devices, and other portable and stationary electronic devices 10. Depending on embodiment, cover glass 12 may be configured as one or more of a front glass 12A, back glass 12B, or a specialty (e.g., camera or lens) cover glass 12C, as shown in FIGS. 1A-3B. Internal accessories 45 may include one or more cameras 24A and 24B, microphone or speaker features 22 and 28, and audio/visual features such as a flash or indicator/display feature 26.

Additional sensor and internal accessory components may also be provided, for example accelerometer or motion sensor 44, a GPS system, or a haptic feedback mechanism such as a vibration motor or haptic actuator. Available external accessories 47 include headphones, speakers, displays, and other external components.

Controller 42 is electronically coupled to display 43, accelerometer 44, internal accessories 45, and one or more control mechanisms 50. Controller 42 includes various microprocessor (μp) and memory components, which can be configured to control device 10 by executing a combination of operating system and application software.

Depending on application, controller 42 is configurable to provide a range of functionality for device 10, including, but not limited to, voice communications, internet browsing, messaging, email, media playback and development, gaming, security, transactions, navigation, and personal assistant functions. Control components 42 may also include communication interfaces and other input-output (IO) devices configured to support voice control and other hard-wired and wireless communications features, including audio, visual, infrared (IR), and radio frequency (RF) connections 46 for external accessories 47, host devices 48, and network systems 49.

Figure 5A:
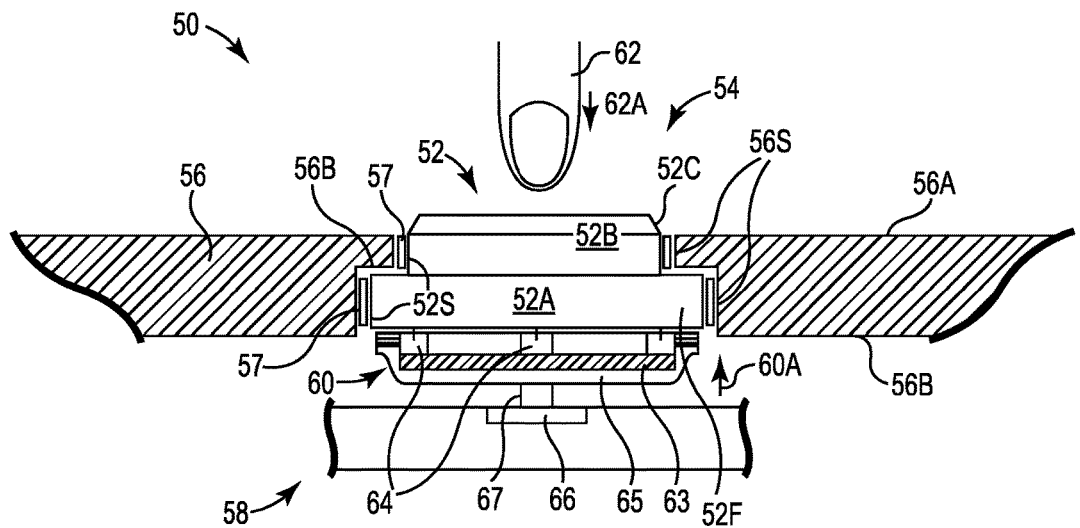
FIG. 5A is a cross-sectional view of a control mechanism for the electronic device, with a single crystal aluminum oxide control member.

FIG. 5A is a cross-sectional view of control mechanism 50 for electronic device 10. Control mechanism 50 includes a single crystal aluminum oxide control button or switch control member 52, positioned within control aperture 54, as defined in housing or cover component 56. Housing 56 may comprise a bottom, top, front, side or back housing 16 or 16A-C, or a front or back cover glass 12A or 12B. Control mechanism 50 may comprise control member 52 for a pushbutton, rocker, or slide switch control mechanism 20, 20A-B, 21 or 21A-21C, as described above with respect to FIGS. 1A-3B.

Pushbutton or switch control member 52 comprises a body portion extending longitudinally along sides 52S from control surface portion 52A, into and through control aperture 54 to contact surface portion 52B. Control surface portion 52A is mechanically coupled to (or otherwise operably connected to) control actuator 58, on the interior of device 10, proximate aperture 54. Contact surface portion 52B is exposed for user manipulation, on the exterior of housing 56.

As shown in FIG. 5A, contact surface portion 52B of control member 52 may be proud of exterior surface 56A of housing 56, projecting above or out of aperture 54. Alternatively, contact surface portion 52B of control member 52 may be flush or recessed with respect to exterior surface 56A of housing 56, within aperture 54.

Button or switch control member 52 may also include one or more bevels or facets 52C, for example adjacent to or on control surface portion 52A. One or more seal elements 57 may be provided to seal aperture 54 in housing 56 about control member 52, for example O-rings or other seal components 57, located between lateral sides 52S of control member 52 and inner sides 56S of housing 56, along the inside of aperture 54.

Retention flange 52F extends transversely from the body of control member 52, inside aperture 54 in device housing 56. A spring, inverted dome, or other resilient bias element 60 can be provided to bias retention flange 52F and the body of control member 52 in an upward or outward direction (arrow 60A), against or proximate one or more interior surfaces 56B of housing 56. Thus, single crystal aluminum oxide button or switch control member 52 may be retained within control aperture 54 during operation of actuator 58, with the body of control member 52 positioned between interior sides 56S of housing 56.

In operation of control mechanism 50, an external (e.g., inward or downward) force or pressure can be applied to button or switch member 52, for example using finger 62, or a stylus, pen, pencil or other device. When the external force on contact surface portion 52B overcomes the outward bias from resilient spring or inverted dome element 60 (arrow 60A), button or switch member 52 moves in an inward direction (arrow 62A) causing actuator 58 to complete an electrical contact, for example via one or more conducting base members 63 and inner and outer conducting pads 64.

Thus, control member 52 is positionable within aperture 54 to operate actuator 58, and to toggle control mechanism 50 between different states, for example ON and OFF. Alternatively, control member 52 operates actuator 58 to select a particular digital or logical state for control mechanism 50 (e.g., 0 or 1), or to scale control mechanism 50 across a digital or analog range. Additional insulator, shim, and contact structures 65, 66, and 67 may also be provided, depending on the coupling configuration and operational arrangement of switch or control member 52 and actuator 58.

Figure 5B:
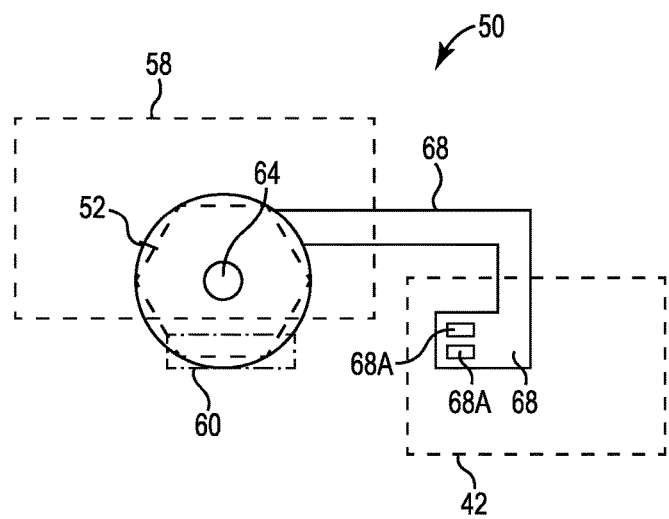
FIG. 5B is a schematic view illustrating internal elements of the control mechanism.

FIG. 5B is a schematic diagram illustrating internal elements of control mechanism 50, including single crystal control member 52 and actuator 58, as shown in FIG. 5A. In general, actuator 58 can be coupled to a controller or other circuit element 42 utilizing flex circuit (or other connector) 68, with terminals 68A. When button or switch member 52 is depressed against bias element 60, one or more pads or other contact elements 64 are positioned in electrical contact, generating a control signal through connector 68. Controller 42 determines the control state of mechanism 50 by sensing the signal across terminals 68A, in order to set or control various operational features such as volume, mute, power, and application status.

Figure 6:
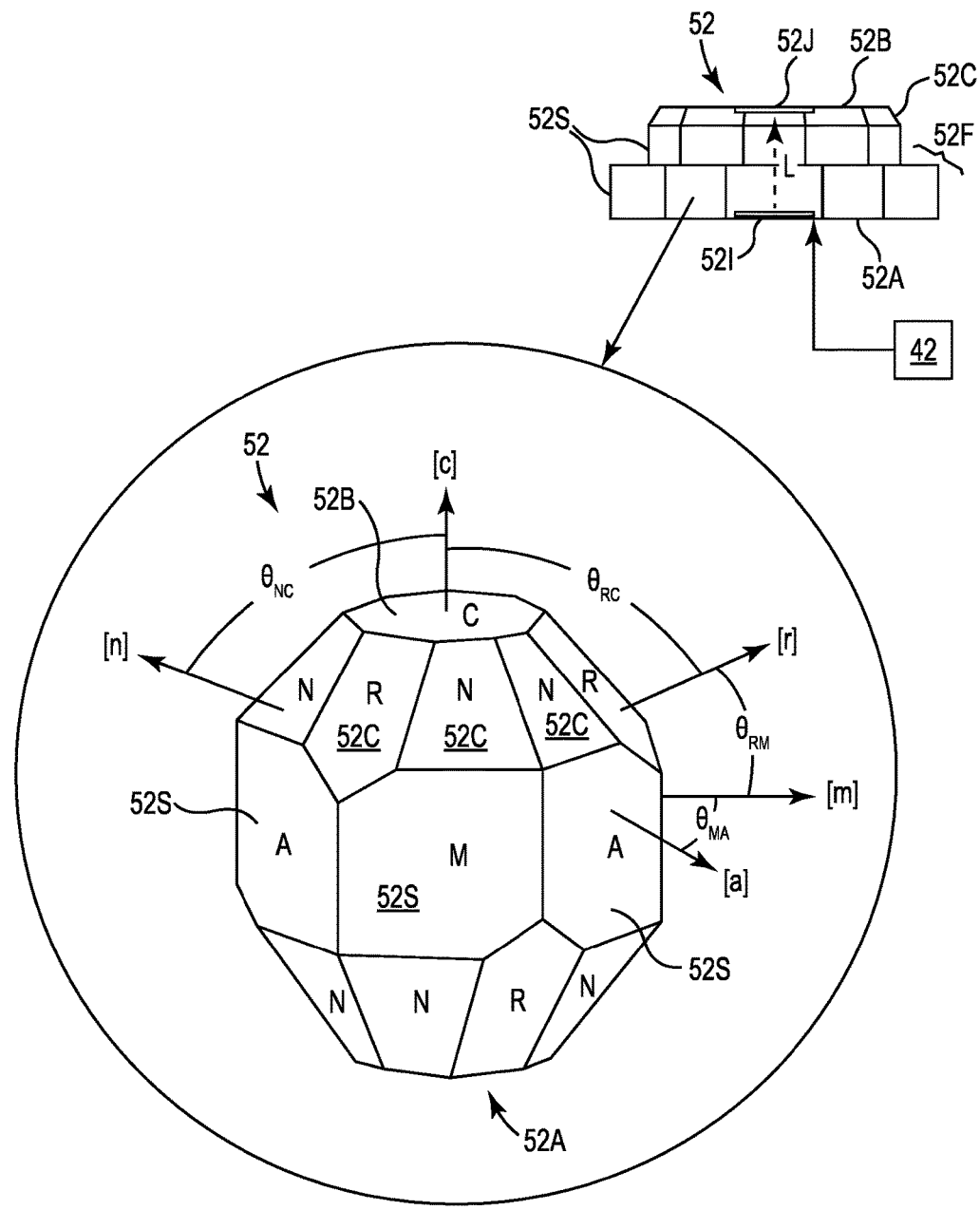
FIG. 6 is a schematic view of representative crystal plane orientations for the single crystal control member.

FIG. 6 is a schematic diagram illustrating the crystal plane orientation of aluminum oxide control member 52, in a substantially single crystal (e.g., corundum, sapphire or ruby) embodiment. As shown in FIG. 6, single crystal aluminum oxide control member 52 exhibits a multi-faceted (e.g., rhombohedral) crystal structure, with individual crystal planes oriented at different angles, including, but not limited to, crystal planes N, C, R, A, and M, respectively.

The angular orientations of the different crystal planes can be defined in terms of perpendicular vectors, for example angle $\theta_{NC}$ of about 61° between perpendiculars [n] and [c] to planes N and C, and angle $\theta_{CR}$ of about 57.6° between perpendiculars [c] and [r] to planes C and R. Additional planar orientations are also shown in FIG. 6, including angle $\theta_{RM}$ of about 32.4° between perpendiculars [r] and [m] to planes R and M, and angle $\theta_{MA}$ of about 30° between perpendiculars [m] and [a] to planes M and A.

Some crystal planes have substantially perpendicular orientations, for example crystal planes A and C, and crystal planes M and C. In the three-dimensional crystal structure of control member 52, however, orthogonal plane relationships are not necessarily transitive, as shown in FIG. 6. For example, while crystal plane A is perpendicular to crystal plane C, and crystal plane C is perpendicular to crystal plane M, crystal plane M is not necessarily perpendicular to crystal plane A.

Control member 52 may be formed by sintering and fusing aluminum oxide (alumina; $Al_2O_3$ or $\alpha$-$Al_2O_3$) in an inert atmosphere, in order to produce a single crystal (or substantially single crystal) sapphire, ruby or corundum boule. Typical synthesis processes include, but are not limited to, Verneuil processes, Czochralski processes, and flux methods. The sapphire boule may be cut (e.g., using industrial diamond tools) to produce control component 52 in the form of a substantially single crystal pushbutton, slide or switch control member, as described above.

In general, the use of a single crystal aluminum oxide materials (e.g., sapphire, corundum, or ruby) provides button or switch member 52 with increased hardness, as compared to plastics and metals such as aluminum and steel, and even as compared to relatively hard glass materials such as silica glass and amorphous silica/alumina glass. The crystal plane orientations of the aluminum oxide material can also be selected to provide particular combinations of stress and strain resistance, depending on the relative orientation of the crystal planes with respect to the different surfaces of control member 52.

In particular, the crystal plane orientations of control member 52 may be selected for strength, surface hardness, and stress and strain resistance. For example, substantially parallel contact and control surfaces 52A and 52B of control member 52 may be oriented along a mechanically strong crystal plane (e.g., plane A or C), and substantially perpendicular side surfaces 52S may be oriented along one or more orthogonal planes (e.g., A, C or M). Similarly, faceted surfaces 52C may also be formed along one or more crystal plane orientations, for example planes N or R.

These particular examples, however, are merely representative. In additional configurations, contact and control surfaces 52A and 52B of single crystal control member 52 may be formed or oriented along any set of substantially parallel crystal planes, including, but not limited to, planes C, N, R, A, or M, or other crystal planes. Similarly, side surfaces 52S of single crystal control member 52 may be formed along any orthogonal (or substantially orthogonal) planes C, N, R, A, or M, as defined with respect to the parallel (or substantially parallel) crystal planes of control and contact surfaces 52A and 52B.

Alternatively, one or more of side and contact surfaces 52A, 52B, and 52S may also be formed or cut across the crystal planes, or in an arbitrary direction, for example to form one or more surfaces 52A, 52B, 52C and 52S of control member 52 into square, rectangular, oblong, circular, elliptical, polygonal, or other shapes, irrespective of the crystal orientation of the aluminum oxide material. Similarly, faceted surfaces 52C may be formed along crystal planes such as C, N, R, A, or M, or faceted surfaces 52C may be formed in arbitrary directions with respect to the crystal plane orientation of control member 52.

In additional applications, two or more substantially single crystal components may be fused together to form button or switch member 52, for example by bonding control surface portion 52A with flange 52F to contact surface portion 52B via thermal fusion. In fused embodiments, an interface layer of polycrystalline or substantially amorphous aluminum oxide may be provided between adjacent single crystal portions 52A and 52B of control member 52, in order to improve thermal bonding. Alternatively, hydrophilic (OH) surfaces may be formed on adjacent single crystal portions 52A and 52B of control member 52, in order to provide hydrogen bonding along the interface, or adjacent single crystal portions 52A and 52B of control member 52 may be bonded by a cold working process, or via a mechanical or adhesive bond.

The aluminum oxide material of control member 52 can also be doped or implanted with a range of different materials to provide desired physical properties, including, but not limited to, color, density, hardness, thermal or electrical conductivity and resistivity, and magnetic permeability or reluctance. For example, the aluminum oxide material of control member 52 may include one or more of iron, titanium, chromium, copper, magnesium and other metal or non-metal components, dopants, or impurities, in order to provide a desired tint or color cast, such as red, orange, yellow, green, blue, violet or purple, or other physical properties such as hardness, conductivity, or permeability. Where chromium impurities are present, for example, control member 52 may be formed as a single crystal ruby structure, or a combination of two or more such structures. Alternatively, control member 52 may be formed as a single crystal ruby, corundum or sapphire structure, or a combination of such structures, in a range of colors or hues, with a range of translucent, transparent, and substantially opaque color densities, and with other selected physical properties, as described above.

One or more indicia 52I or 52J may also be provided, for example as formed in or on control surface 52A or contact surface 52B, respectively, as shown in FIG. 6. Indicia 52I and 52J may be formed by cutting, abrasion, or other subtractive machining technique, or in the form of an applied pigment, coating, or mechanical component, such as a metal or plastic indicia. Alternatively, indicia 52I or 52J may include a light emitting indicator coupled to controller 42 in order to provide alerts and other operational indicator functionality, as described below.

Particular forms of indicia 52I and 52J include, for example, volume, mute, and hold indicators, and other identifying marks related to the operational function of control member 52. Where control member 52 is provided as a substantially clear, transparent, or translucent structure, moreover, the color density of control member 52 can be selected such that any internal indicia 52I in or on control surface 52A may be visible as external indicia 52J, through contact surface 52B, via selecting the impurities or dopants for light transmission (L) through the body of control member 52. Thus, internal indicia 52I may be protected from wear and other environmental effects, while visible for use as external indicia 52J during operation of control member 52.

In additional examples, indicia 52I or 52J may take the form of an LED or other light emitting indicator. Thus, any incoming call, message, reminder, alert, alarm or other notification that might otherwise be shown in a display screen or indicated using a vibration motor or other haptic device can also be presented as a light emitting indicia 52I or 52J, for example a flashing LED or steady indicator light 52I in combination with a clear or substantially transparent or translucent control member 52, such that internal indicia 52I may also be visible as external indicia 52J.

In this configuration, custom notifications can also be sent to individual buttons or other control members 52 on different control mechanisms 50, using different lighted indicia 52I and 52J. For example, user-definable control parameters can be provided for controller 42 to set internal hold button indicators 52I for high, medium, or low priority messages, calls, reminders, and other alerts or alarms, in combination with different levels of priority indicators 52I for other control mechanisms 50, including volume buttons, mute switch, home buttons, and other control members 52. In substantially clear, transparent, or translucent configurations of control member 52, such internal indicia 52I may also be visible as external indicia 52J, by transmission of light L through the body of control member 52. Thus, besides scratch resistance and durability, another potential application of the present disclosure is to leverage the optical properties of control member 52, in order to provide additional user alert and signal communications capability based on illuminated indicia 52I and 52J.

FIG. 7A is a cross-sectional view of control device 50, with control member 52 provided in a dual actuator or rocker switch type configuration. In this particular example, control member 52 has a substantially elongated geometry, with one or more contact surface portions 52B extending across two separate, independently operable actuator mechanism 52A and 52B. Pressure or force may be applied to control member 52 in two separate locations (e.g., arrows 62A), in order to overcome the bias force in one or more spring or bias elements 60 (arrows 60A), operating one or both of actuator mechanisms 56A and 56B.

FIG. 7A also illustrates that while aperture 54 may be provided in a "stepped" configuration within housing 56, for example as shown in FIG. 5A (and FIG. 7B, below), with separate inner surfaces 56B and side surfaces 56S at different positions along aperture 54, this is merely representative. In other designs, aperture 54 may be formed in a substantially straight or beveled (unstepped) configuration, as shown in FIG. 7A, with side surfaces 52S forming additional inner surfaces 52B of housing 56. Further, flange portion 52F of control member 52 can also be configured accordingly, in order to retain the body of control member 52 within control aperture 54 during operation of actuator 58, for example by biasing side surfaces 52S of control member 52 against or toward side (or inner) surfaces 52S (or 52B) of housing 56, along the corresponding sides of aperture 54.

FIG. 7B is a cross-sectional view of control device 50, with control member 52 provided in a sliding switch type actuator configuration. In this particular example, control member 52 is configured to slide transversely within control aperture 54, from a first lateral position along sliding member or switch translation surface 72, in which control member 52 operates or actuates first control actuator 58A, to a second lateral position along sliding member or switch translation surface 72, in which control member 52 operates or actuates second control actuator 58B.

In sliding switch configurations, as illustrated in FIG. 7B, the actuation direction of control member 52 (arrow 62B) is substantially lateral, along the plane of housing 56 within control aperture 54. Control member 52 can be retained within aperture 54 by the biasing force of one or more springs or resilient members 60, which bias flange portion 52F on the body of control member 52 against one or more inner surfaces 56B of housing 56, as described above for the button configuration of FIGS. 5A and 5B, and as shown for the rocker switch configuration of FIG. 7A.

In particular, the sliding switch actuation direction (arrow 62B) can be considered to extend in or out of the plane of FIG. 5A, with flange portions 52F on either side, and with control aperture 54 extending laterally along the actuation direction, as shown in FIG. 7B. Depending on desired control functionality, sliding switch and rocker type control mechanisms 50 can also be configured with a single bias-activated control actuator 52, as shown in FIGS. 5A and 5B, or with two or more independent control actuators 52A and 52B, as shown in FIGS. 7A and 7B.

While this invention has been described with reference to exemplary embodiments, it will be understood by those skilled in the art that various changes can be made and equivalents may be substituted for elements thereof, without departing from the spirit and scope of the invention. In addition, modifications may be made to adapt the teachings of the invention to particular situations and materials, without departing from the essential scope thereof. Thus, the invention is not limited to the particular examples that are disclosed herein, but encompasses all embodiments falling within the scope of the appended claims.

We claim:

1. An electronic device, comprising:
    a housing defining an opening;
    a control member at least partially disposed within the opening, the control member comprising:
        an aluminum oxide member having a first surface operative to receive a user-input, the aluminum oxide member being substantially monocrystalline such that the first surface is oriented along a first crystal plane of the aluminum oxide member;
        a body member having a second surface opposite the first surface and operable to actuate a control actuator in response to the user input; and
    a bias element configured to bias a portion of the control member against the housing.

2. The electronic device of claim 1, wherein a portion of the body member is configured to retain the control member within the opening of the housing.

3. The electronic device of claim 2, wherein:
    the portion of the body member comprises a flange; and the bias element is configured to bias the flange against an inner surface of the housing.

4. The electronic device of claim 1, wherein:
the aluminum oxide member has a second surface opposite to the first surface;
the second surface is oriented along a second crystal plane parallel to the first crystal plane of the aluminum oxide member.

5. The electronic device of claim 4, wherein:
the aluminum oxide member further comprises at least one side surface extending between the first and second surfaces of the aluminum oxide member; and
the at least one side surface is oriented along an orthogonal crystal plane of the aluminum oxide material, as defined with respect to the first and second crystal planes.

6. The electronic device of claim 4, wherein:
the aluminum oxide member further comprises at least one side surface extending between the first and second surfaces of the aluminum oxide member and the side surface is formed or cut across the crystal planes.

7. The electronic device of claim 1, wherein the aluminum oxide member comprises a metal including one or more of iron, titanium, chromium, copper, and magnesium.

8. The electronic device of claim 7, wherein the aluminum oxide member has a substantially transparent or translucent color and a surface hardness that is greater than that of silica glass.

9. The electronic device of claim 7, further comprising a cover attached to a front surface of the housing, wherein the cover defines a transparent display window.

10. The electronic device of claim 1, wherein the aluminum oxide member is a sapphire member.

11. A device comprising:
a housing;
a cover glass coupled to the housing and forming an exterior surface of the device;
an aperture defined in the housing or the cover glass;
an actuator positioned proximate the aperture and within the device;
a control member positioned at least partially within the aperture, the control member comprising:
a contact surface portion exposed to an exterior of the device and formed from a single crystal sapphire material, the contact surface portion being oriented parallel to a crystal plane of the sapphire material;
a body positioned below the contact surface and operable to actuate the actuator; and
a flange portion extending laterally from the body of the control member; and
a biasing element configured to bias the flange portion of the control member toward an inner surface of the housing.

12. The device of claim 11, wherein a side surface of the control member is oriented along an orthogonal crystal plane of the sapphire material, as defined with respect to the crystal plane parallel to the contact surface portion.

13. The device of claim 11, wherein the control member includes a bevel formed around the contact surface portion.

14. The device of claim 11, wherein a side surface of the control member is formed or cut across the crystal planes.

15. An electronic device comprising:
a housing;
a cover coupled to the housing and defining an opening;
an actuator positioned within the housing and proximate the opening;
a control member extending at least partially through the opening and configured to operate the actuator, the control member comprising:
a sapphire member having a contact surface exposed to an exterior of the electronic device, the sapphire member being substantially monocrystalline and a crystal plane of the sapphire member being oriented parallel to the contact surface;
a control surface for actuating the actuator; and
a body portion positioned between the contact surface and the control surface;
wherein the body portion of the control member includes a feature that is configured to retain the control member within the housing.

16. The electronic device of claim 15, further comprising a biasing element configured to bias the control member against an internal surface of the electronic device.

17. The electronic device of claim 15, wherein the feature of the body portion includes a flange that is biased toward an inner surface of the cover.

18. The electronic device of claim 15, wherein the sapphire member includes a bevel formed around the contact surface.

19. The device of claim 15, wherein the single crystal sapphire material is substantially transparent.

* * * * *